(12) United States Patent
Mauer

(10) Patent No.: US 7,814,137 B1
(45) Date of Patent: Oct. 12, 2010

(54) COMBINED INTERPOLATION AND DECIMATION FILTER FOR PROGRAMMABLE LOGIC DEVICE

(75) Inventor: Volker Mauer, Lacey Green (GB)

(73) Assignee: Altera Corporation, San Jose, CA (US)

( * ) Notice: Subject to any disclaimer, the term of this patent is extended or adjusted under 35 U.S.C. 154(b) by 947 days.

(21) Appl. No.: 11/621,359

(22) Filed: Jan. 9, 2007

(51) Int. Cl.
  G06F 17/10 (2006.01)
(52) U.S. Cl. .................................... 708/300
(58) Field of Classification Search .......... 708/300–323
  See application file for complete search history.

(56) References Cited

U.S. PATENT DOCUMENTS

| | | | |
|---|---|---|---|
| 3,473,160 A | 10/1969 | Wahlstrom | |
| 4,156,927 A | 5/1979 | McElroy et al. | |
| 4,179,746 A | 12/1979 | Tubbs | |
| 4,212,076 A | 7/1980 | Conners | |
| 4,215,406 A | 7/1980 | Gomola et al. | |
| 4,215,407 A | 7/1980 | Gomola et al. | |
| 4,422,155 A | 12/1983 | Amir et al. | |
| 4,484,259 A | 11/1984 | Palmer et al. | |
| 4,521,907 A | 6/1985 | Amir et al. | |
| 4,597,053 A | 6/1986 | Chamberlin | |
| 4,623,961 A | 11/1986 | Mackiewicz | |
| 4,682,302 A | 7/1987 | Williams | |
| 4,718,057 A | 1/1988 | Venkitakrishnan et al. | |
| 4,727,508 A | 2/1988 | Williams | |
| 4,791,590 A | 12/1988 | Ku et al. | |
| 4,799,004 A | 1/1989 | Mori | |
| 4,823,295 A | 4/1989 | Mader | |
| 4,839,847 A | 6/1989 | Laprade | |
| 4,871,930 A | 10/1989 | Wong et al. | |
| 4,912,345 A | 3/1990 | Steele et al. | |
| 4,918,637 A * | 4/1990 | Morton ....................... | 708/313 |
| 4,967,160 A | 10/1990 | Quievy et al. | |
| 4,982,354 A | 1/1991 | Takeuchi et al. | |
| 4,991,010 A * | 2/1991 | Hailey et al. ................. | 708/313 |
| 4,994,997 A | 2/1991 | Martin et al. | |

(Continued)

FOREIGN PATENT DOCUMENTS

EP  0 158 430  10/1985

(Continued)

OTHER PUBLICATIONS

Amos, D., "PLD architectures match DSP algorithms," *Electronic Product Design*, vol. 17, No. 7, Jul. 1996, pp. 30, 32.

(Continued)

*Primary Examiner*—Chat C Do
(74) *Attorney, Agent, or Firm*—Ropes & Gray LLP; Jeffrey H. Ingerman

(57) ABSTRACT

A programmable logic device can be configured as a finite impulse response (FIR) filter capable of operating in either interpolation mode or decimation mode and of switching between those modes at run time. The FIR filter structure can be mapped onto a specialized processing block of the programmable logic device that includes multipliers and adders for adding the products of the multipliers. The FIR filter structure minimizes the number of multipliers used by reusing various calculations that are repeated as a result of the interpolation or decimation operation, using multiplexers or other run-time-controllable selectors to select which current or stored multiplier outputs to use.

24 Claims, 11 Drawing Sheets

U.S. PATENT DOCUMENTS

| | | | |
|---|---|---|---|
| 5,122,685 A | 6/1992 | Chan et al. | |
| 5,128,559 A | 7/1992 | Steele | |
| 5,175,702 A | 12/1992 | Beraud et al. | |
| 5,208,491 A | 5/1993 | Ebeling et al. | |
| RE34,363 E | 8/1993 | Freeman | |
| 5,267,187 A | 11/1993 | Hsieh et al. | |
| 5,296,759 A | 3/1994 | Sutherland et al. | |
| 5,338,983 A | 8/1994 | Agarwala | |
| 5,339,263 A * | 8/1994 | White | 708/313 |
| 5,349,250 A | 9/1994 | New | |
| 5,357,152 A | 10/1994 | Jennings, III et al. | |
| 5,371,422 A | 12/1994 | Patel et al. | |
| 5,381,357 A | 1/1995 | Wedgwood et al. | |
| 5,404,324 A | 4/1995 | Colon-Bonet | |
| 5,424,589 A | 6/1995 | Dobbelaere et al. | |
| 5,446,651 A | 8/1995 | Moyse et al. | |
| 5,451,948 A | 9/1995 | Jekel | |
| 5,452,231 A | 9/1995 | Butts et al. | |
| 5,452,375 A | 9/1995 | Rousseau et al. | |
| 5,457,644 A | 10/1995 | McCollum | |
| 5,465,226 A | 11/1995 | Goto | |
| 5,465,375 A | 11/1995 | Thepaut et al. | |
| 5,483,178 A | 1/1996 | Costello et al. | |
| 5,497,498 A | 3/1996 | Taylor | |
| 5,500,812 A | 3/1996 | Saishi et al. | |
| 5,500,828 A | 3/1996 | Doddington et al. | |
| 5,523,963 A | 6/1996 | Hsieh et al. | |
| 5,528,550 A | 6/1996 | Pawate et al. | |
| 5,537,601 A | 7/1996 | Kimura et al. | |
| 5,541,864 A * | 7/1996 | Van Bavel et al. | 708/313 |
| 5,546,018 A | 8/1996 | New et al. | |
| 5,550,993 A | 8/1996 | Ehlig et al. | |
| 5,559,450 A | 9/1996 | Ngai et al. | |
| 5,563,526 A | 10/1996 | Hastings et al. | |
| 5,563,819 A | 10/1996 | Nelson | |
| 5,570,039 A | 10/1996 | Oswald et al. | |
| 5,570,040 A | 10/1996 | Lytle et al. | |
| 5,572,148 A | 11/1996 | Lytle et al. | |
| 5,581,501 A | 12/1996 | Sansbury et al. | |
| 5,590,350 A | 12/1996 | Guttag et al. | |
| 5,594,366 A | 1/1997 | Khong et al. | |
| 5,594,912 A | 1/1997 | Brueckmann et al. | |
| 5,596,763 A | 1/1997 | Guttag et al. | |
| 5,606,266 A | 2/1997 | Pedersen | |
| 5,617,058 A | 4/1997 | Adrian et al. | |
| 5,633,601 A | 5/1997 | Nagaraj | |
| 5,636,150 A | 6/1997 | Okamoto | |
| 5,636,368 A | 6/1997 | Harrison et al. | |
| 5,640,578 A | 6/1997 | Balmer et al. | |
| 5,644,522 A | 7/1997 | Moyse et al. | |
| 5,646,545 A | 7/1997 | Trimberger et al. | |
| 5,648,732 A | 7/1997 | Duncan | |
| 5,652,903 A | 7/1997 | Weng et al. | |
| 5,655,069 A | 8/1997 | Ogawara et al. | |
| 5,664,192 A | 9/1997 | Lloyd et al. | |
| 5,689,195 A | 11/1997 | Cliff et al. | |
| 5,696,708 A | 12/1997 | Leung | |
| 5,729,495 A | 3/1998 | Madurawe | |
| 5,740,404 A | 4/1998 | Baji | |
| 5,744,980 A | 4/1998 | McGowan et al. | |
| 5,744,991 A | 4/1998 | Jefferson et al. | |
| 5,754,459 A | 5/1998 | Telikepalli | |
| 5,761,483 A | 6/1998 | Trimberger | |
| 5,764,555 A | 6/1998 | McPherson et al. | |
| 5,768,613 A | 6/1998 | Asghar | |
| 5,777,912 A | 7/1998 | Leung et al. | |
| 5,784,636 A | 7/1998 | Rupp | |
| 5,790,446 A | 8/1998 | Yu et al. | |
| 5,794,067 A | 8/1998 | Kadowaki | |
| 5,801,546 A | 9/1998 | Pierce et al. | |
| 5,805,477 A | 9/1998 | Perner | |
| 5,805,913 A | 9/1998 | Guttag et al. | |
| 5,808,926 A | 9/1998 | Gorshtein et al. | |
| 5,812,479 A | 9/1998 | Cliff et al. | |
| 5,812,562 A | 9/1998 | Baeg | |
| 5,815,422 A | 9/1998 | Dockser | |
| 5,821,776 A | 10/1998 | McGowan | |
| 5,825,202 A | 10/1998 | Tavana et al. | |
| 5,838,165 A | 11/1998 | Chatter | |
| 5,841,684 A | 11/1998 | Dockser | |
| 5,847,579 A | 12/1998 | Trimberger | |
| 5,847,981 A | 12/1998 | Kelley et al. | |
| 5,859,878 A | 1/1999 | Phillips et al. | |
| 5,869,979 A | 2/1999 | Bocchino | |
| 5,872,380 A | 2/1999 | Rostoker et al. | |
| 5,874,834 A | 2/1999 | New | |
| 5,878,250 A | 3/1999 | LeBlanc | |
| 5,880,981 A | 3/1999 | Kojima et al. | |
| 5,892,962 A | 4/1999 | Cloutier | |
| 5,894,228 A | 4/1999 | Reddy et al. | |
| 5,898,602 A | 4/1999 | Rothman et al. | |
| 5,931,898 A | 8/1999 | Khoury | |
| 5,942,914 A | 8/1999 | Reddy et al. | |
| 5,944,774 A | 8/1999 | Dent | |
| 5,949,710 A | 9/1999 | Pass et al. | |
| 5,951,673 A | 9/1999 | Miyata | |
| 5,956,265 A | 9/1999 | Lewis | |
| 5,959,871 A | 9/1999 | Pierzchala et al. | |
| 5,960,193 A | 9/1999 | Guttag et al. | |
| 5,961,635 A | 10/1999 | Guttag et al. | |
| 5,963,048 A | 10/1999 | Harrison et al. | |
| 5,963,050 A | 10/1999 | Young et al. | |
| 5,968,196 A | 10/1999 | Ramamurthy et al. | |
| 5,970,254 A | 10/1999 | Cooke et al. | |
| 5,978,260 A | 11/1999 | Trimberger et al. | |
| 5,982,195 A | 11/1999 | Cliff et al. | |
| 5,986,465 A | 11/1999 | Mendel | |
| 5,991,788 A | 11/1999 | Mintzer | |
| 5,991,898 A | 11/1999 | Rajski et al. | |
| 5,995,748 A | 11/1999 | Guttag et al. | |
| 5,999,015 A | 12/1999 | Cliff et al. | |
| 5,999,990 A | 12/1999 | Sharrit et al. | |
| 6,005,806 A | 12/1999 | Madurawe et al. | |
| 6,006,321 A | 12/1999 | Abbott | |
| 6,009,451 A | 12/1999 | Burns | |
| 6,018,755 A | 1/2000 | Gonikberg et al. | |
| 6,020,759 A | 2/2000 | Heile | |
| 6,021,423 A | 2/2000 | Nag et al. | |
| 6,029,187 A | 2/2000 | Verbauwhede | |
| 6,031,763 A | 2/2000 | Sansbury | |
| 6,041,340 A | 3/2000 | Mintzer | |
| 6,052,327 A | 4/2000 | Reddy et al. | |
| 6,052,755 A | 4/2000 | Terrill et al. | |
| 6,055,555 A | 4/2000 | Boswell et al. | |
| 6,064,614 A | 5/2000 | Khoury | |
| 6,065,131 A | 5/2000 | Andrews et al. | |
| 6,066,960 A | 5/2000 | Pedersen | |
| 6,069,487 A | 5/2000 | Lane et al. | |
| 6,072,994 A | 6/2000 | Phillips et al. | |
| 6,073,154 A | 6/2000 | Dick | |
| 6,075,381 A | 6/2000 | LaBerge | |
| 6,084,429 A | 7/2000 | Trimberger | |
| 6,085,317 A | 7/2000 | Smith | |
| 6,091,261 A | 7/2000 | DeLange | |
| 6,091,765 A | 7/2000 | Pietzold, III et al. | |
| 6,094,726 A | 7/2000 | Gonion et al. | |
| 6,097,988 A | 8/2000 | Tobias | |
| 6,098,163 A | 8/2000 | Guttag et al. | |
| 6,107,820 A | 8/2000 | Jefferson et al. | |
| 6,107,821 A | 8/2000 | Kelem et al. | |
| 6,107,824 A | 8/2000 | Reddy et al. | |
| 6,130,554 A | 10/2000 | Kolze et al. | |
| 6,140,839 A | 10/2000 | Kaviani et al. | |
| 6,154,049 A | 11/2000 | New | |

| | | | |
|---|---|---|---|
| 6,157,210 A | 12/2000 | Zaveri et al. | |
| 6,163,788 A | 12/2000 | Chen et al. | |
| 6,167,415 A | 12/2000 | Fischer et al. | |
| 6,175,849 B1 | 1/2001 | Smith | |
| 6,215,326 B1 | 4/2001 | Jefferson et al. | |
| 6,226,735 B1 | 5/2001 | Mirsky | |
| 6,242,947 B1 | 6/2001 | Trimberger | |
| 6,243,729 B1 | 6/2001 | Staszewski | |
| 6,246,258 B1 | 6/2001 | Lesea | |
| 6,279,021 B1 | 8/2001 | Takano et al. | |
| 6,286,024 B1 | 9/2001 | Yano et al. | |
| 6,314,442 B1 | 11/2001 | Suzuki | |
| 6,314,551 B1 | 11/2001 | Borland | |
| 6,321,246 B1 | 11/2001 | Page et al. | |
| 6,323,680 B1 | 11/2001 | Pedersen et al. | |
| 6,327,605 B2 | 12/2001 | Arakawa et al. | |
| 6,351,142 B1 | 2/2002 | Abbott | |
| 6,353,843 B1 | 3/2002 | Chehrazi et al. | |
| 6,359,468 B1 | 3/2002 | Park et al. | |
| 6,360,240 B1 * | 3/2002 | Takano et al. | 708/319 |
| 6,362,650 B1 | 3/2002 | New et al. | |
| 6,366,944 B1 | 4/2002 | Hossain et al. | |
| 6,367,003 B1 | 4/2002 | Davis | |
| 6,369,610 B1 | 4/2002 | Cheung et al. | |
| 6,377,970 B1 | 4/2002 | Abdallah et al. | |
| 6,407,576 B1 | 6/2002 | Ngai et al. | |
| 6,407,694 B1 | 6/2002 | Cox et al. | |
| 6,434,587 B1 | 8/2002 | Liao et al. | |
| 6,438,569 B1 | 8/2002 | Abbott | |
| 6,438,570 B1 | 8/2002 | Miller | |
| 6,446,107 B1 | 9/2002 | Knowles | |
| 6,453,382 B1 | 9/2002 | Heile | |
| 6,467,017 B1 | 10/2002 | Ngai et al. | |
| 6,480,980 B2 | 11/2002 | Koe | |
| 6,483,343 B1 | 11/2002 | Faith et al. | |
| 6,487,575 B1 | 11/2002 | Oberman | |
| 6,523,055 B1 | 2/2003 | Yu et al. | |
| 6,531,888 B2 | 3/2003 | Abbott | |
| 6,538,470 B1 | 3/2003 | Langhammer et al. | |
| 6,542,000 B1 | 4/2003 | Black et al. | |
| 6,556,044 B2 | 4/2003 | Langhammer et al. | |
| 6,557,092 B1 | 4/2003 | Callen | |
| 6,571,268 B1 | 5/2003 | Giacalone et al. | |
| 6,573,749 B2 | 6/2003 | New et al. | |
| 6,574,762 B1 | 6/2003 | Karimi et al. | |
| 6,591,283 B1 | 7/2003 | Conway et al. | |
| 6,591,357 B2 | 7/2003 | Mirsky | |
| 6,600,495 B1 * | 7/2003 | Boland et al. | 708/300 |
| 6,600,788 B1 | 7/2003 | Dick et al. | |
| 6,628,140 B2 | 9/2003 | Langhammer et al. | |
| 6,687,722 B1 | 2/2004 | Larsson et al. | |
| 6,692,534 B1 | 2/2004 | Wang et al. | |
| 6,700,581 B2 | 3/2004 | Baldwin et al. | |
| 6,725,441 B1 | 4/2004 | Keller et al. | |
| 6,728,901 B1 | 4/2004 | Rajski et al. | |
| 6,731,133 B1 | 5/2004 | Feng et al. | |
| 6,744,278 B1 | 6/2004 | Liu et al. | |
| 6,745,254 B2 | 6/2004 | Boggs et al. | |
| 6,763,367 B2 | 7/2004 | Kwon et al. | |
| 6,771,094 B1 | 8/2004 | Langhammer et al. | |
| 6,774,669 B1 | 8/2004 | Liu et al. | |
| 6,781,408 B1 | 8/2004 | Langhammer | |
| 6,781,410 B2 | 8/2004 | Pani et al. | |
| 6,788,104 B2 | 9/2004 | Singh et al. | |
| 6,836,839 B2 | 12/2004 | Master et al. | |
| 6,874,079 B2 | 3/2005 | Hogenauer | |
| 6,904,471 B2 | 6/2005 | Boggs et al. | |
| 6,924,663 B2 | 8/2005 | Masui et al. | |
| 6,963,890 B2 | 11/2005 | Dutta et al. | |
| 6,971,083 B1 | 11/2005 | Farrugia et al. | |
| 7,093,204 B2 | 8/2006 | Oktem et al. | |
| 7,107,305 B2 | 9/2006 | Deng et al. | |
| 7,181,484 B2 | 2/2007 | Stribaek et al. | |
| 7,313,585 B2 | 12/2007 | Winterrowd | |
| 7,395,298 B2 | 7/2008 | Debes et al. | |
| 7,409,417 B2 * | 8/2008 | Lou | 708/316 |
| 7,415,542 B2 * | 8/2008 | Hennedy et al. | 708/300 |
| 7,421,465 B1 | 9/2008 | Rarick et al. | |
| 7,428,566 B2 | 9/2008 | Siu et al. | |
| 7,430,578 B2 | 9/2008 | Debes et al. | |
| 7,472,155 B2 | 12/2008 | Simkins et al. | |
| 7,590,676 B1 | 9/2009 | Langhammer | |
| 7,646,430 B2 * | 1/2010 | Brown Elliott et al. | 348/581 |
| 2001/0023425 A1 | 9/2001 | Oberman et al. | |
| 2001/0029515 A1 | 10/2001 | Mirsky | |
| 2002/0002573 A1 | 1/2002 | Landers et al. | |
| 2002/0089348 A1 | 7/2002 | Langhammer | |
| 2002/0116434 A1 | 8/2002 | Nancekievill | |
| 2003/0088757 A1 | 5/2003 | Lindner et al. | |
| 2004/0064770 A1 | 4/2004 | Xin | |
| 2004/0083412 A1 | 4/2004 | Corbin et al. | |
| 2004/0148321 A1 | 7/2004 | Guevorkian et al. | |
| 2004/0178818 A1 | 9/2004 | Crotty et al. | |
| 2004/0193981 A1 | 9/2004 | Clark et al. | |
| 2004/0267863 A1 | 12/2004 | Bhushan et al. | |
| 2005/0038401 A1 * | 2/2005 | Stoye | 708/306 |
| 2005/0144212 A1 | 6/2005 | Simkins et al. | |
| 2005/0144215 A1 * | 6/2005 | Simkins et al. | 708/620 |
| 2005/0144216 A1 | 6/2005 | Simkins et al. | |
| 2005/0166038 A1 | 7/2005 | Wang et al. | |
| 2005/0187999 A1 | 8/2005 | Zheng et al. | |
| 2009/0187615 A1 * | 7/2009 | Abe et al. | 708/313 |

FOREIGN PATENT DOCUMENTS

| | | |
|---|---|---|
| EP | 0 380 456 | 8/1990 |
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 7-135447 | 5/1995 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO2005/101190 | 10/2005 |

OTHER PUBLICATIONS

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs," *Field-Programmable Logic and Applications. Roadmap to Reconfigurable Computing. 10th International Conference, FPL 2000. Proceedings (Lecture Notes in Computer Science* vol. 1896), Aug. 27-30, 2000, pp. 456-461.

Aoki, T., "Signed-weight arithmetic and its application to a field-programmable digital filter architecture," *IEICE Transactions on Electronics*, 1999 , vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg. B.L., et al."Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings-Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL'98. Proceedings*, Hartenstein, R.W., et al., eds., Aug. 31-Sep. 3, 1998, pp. 441-445.

Gaffar, A.A., et al., "Floating-Point Bitwidth Analysis via Automatic Differentiation," *IEEE Conference on Field Programmable Technology*, Hong Kong, Dec. 2002.

Guccione, S.A.,"Run-time Reconfiguration at Xilinx," *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http://www.ee.washington.edu/people/faculty/hauck/publications/ReconfigFuture.Pdf.

Heysters, P.M., et al., "Mapping of DSP algorithms on field programmable function arrays," *Filed-Programmable Logic and Applications. Roadmap to Reconfiqurable Computing. 10th International Conference FPL 2000. Proceedings (Lecture Notes in Computer Science* vol. 1896), Aug. 27-30, 2000, pp. 400-411.

Huang, J. et al., "Simulated Performance of 1000BASE-T Receiver with Different Analog Front End Designs," *Proceedings of the 35th Asilomar Conference on Signals, Systems, and Computers*, Nov. 4-7, 2001.

Lattice Semiconductor Corp, *ORCA® FPGA Express™ Interface Manual*: ispLEVER® Version 3.0, 2002.

Lucent Technologies, Microelectronics Group,"Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA," *1996 2nd International Conference on ASIC Proceedings (IEEE Cat. No. 96TH8140)* Oct. 21-24, 1996, pp. 275-279.

Jones, G., "Field-programmable digital signal conditioning," *Electronic Product Design*, vol. 21, No. 6, Jun. 2000, pp. C36-38.

Kiefer, R., et al., "Performance comparison of software/FPGA hardware partitions for a DSP application," *14th Australian Microelectronics Conference. Microelectronics: Technology Today for the Future. MICRO '97 Proceedings*, Sep. 28-Oct. 1, 1997, pp. 88-93.

Kramberger, I., "DSP acceleration using a reconfigurable FPGA " *ISIE '99. Proceedings of the IEEE International Symposium on Industrial Electronics (Cat. No. 99TH8465)* vol. 3, Jul. 12-16, 1999, pp. 1522-1525.

Langhammer, M., "How to implement DSP in programmable logic," *Elettronica Oggi*, No. 266 , Dec. 1998, pp. 113-115.

Langhammer, M., "Implementing a DSP in Programmable Logic," *Online EE Times*, May 1998, http://www.eetimes.com/editorial/1998/coverstory9805.html.

Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," First International Conference on 3G Mobile Communication Technologies (Conf. Publ. No. 471), Mar. 27-29, 2000, pp. 306-310.

Miller, N. L., et al., "Reconfigurable integrated circuit for high performance computer arithmetic," *Proceedings of the 1998 IEEE Colloquium on Evolvable Hardware Systems (Digest)*, No. 233, 1998, pp. 2/1-2/4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electcronics, Control and Instrumentation (Cat. No. 91CH2976-9)*, vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000:2000 IEEE Radio and Wireless Conference (Cat. No. 00EX404)*, Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-83.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications (Cat. No. 99EX303)*, Jul. 26-28,1999, pp. 147-50.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL'99, Proceedings (Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14, Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http://www.iro.umontreal.ca/~aboulham/F6221/Xilinx%20A%201D%20systolic%20FIR.htm.

Xilinx, Inc., "The Future of FPGA's," White Paper, available Nov. 14, 2005 for download from http://www.xilinx.com/prs_rls,5yrwhite.htm.

Langhammer et al. U.S. Appl. No. 11/426,403, filed Jun. 26, 2006.
Lee et al. U.S. Appl. No. 11/447,329, filed Jun. 5, 2006.
Langhammer et al. U.S. Appl. No. 11/447,370, filed Jun. 5, 2006.
Langhammer et al. U.S. Appl. No. 11/447,472, filed Jun. 5, 2006.
Lee et al. U.S. Appl. No. 11/447,474, filed Jun. 5, 2006.
Langhammer et al. U.S. Appl. No. 11/458,361, filed Jul. 18, 2006.
Langhammer et al. U.S. Appl. No. 11/566,982, filed Dec. 5, 2006.

Altera Corporation, "DSP Blocks in Stratix II and Stratix II GX Devices," *Stratix II Device Handbook,* vol. 2, Chapter 6, v4.0 (Oct. 2005).

Underwood, K. "FPGAs vs. CPUs: Trends in Peak Floating-Point Performance," *Proceedings of the 2004 ACM/SIGDA 12th International Symposium on Field Programmable Gate Arrays*, pp. 171-180, Feb. 22-24, 2004.

Weisstein, E.W., "Karatsuba Multiplication," *MathWorld—A Wolfram Web Resource* (Dec. 9, 2007), accessed Dec. 11, 2007 at http://mathworld.wolfram.com/KaratsubaMultiplication.html.

Xilinx Inc., "XtremeDSP Design Considerations User Guide," v 1.2, Feb. 4, 2005.

Altera Corporation, "Digital Signal Processing (DSP)," *Stratix Device Handbook*, vol. 2, Chapter 6 and Chapter 7, v1.1 (Sep. 2004).

\* cited by examiner $y_0 = c_0 s_0 + c_1 s_{-1} + c_2 s_{-2} + c_1 s_{-3} + c_0 s_{-4}$
$y_1 = c_0 s_1 + c_1 s_0 + c_2 s_{-1} + c_1 s_{-2} + c_0 s_{-3}$
$y_2 = c_0 s_2 + c_1 s_1 + c_2 s_0 + c_1 s_{-1} + c_0 s_{-2}$
$y_3 = c_0 s_3 + c_1 s_2 + c_2 s_1 + c_1 s_0 + c_0 s_{-1}$
$y_4 = c_0 s_4 + c_1 s_3 + c_2 s_2 + c_1 s_1 + c_0 s_0$
$y_5 = c_0 s_5 + c_1 s_4 + c_2 s_3 + c_1 s_2 + c_0 s_1$
$y_6 = c_0 s_6 + c_1 s_5 + c_2 s_4 + c_1 s_3 + c_0 s_2$
$y_7 = c_0 s_7 + c_1 s_6 + c_2 s_5 + c_1 s_4 + c_0 s_3$

INTERPOLATION $y_0 = c_0(s_0 + s_{-10}) + c_2(s_{-2} + s_{-8}) + c_4(s_{-4} + s_{-6})$ $y_1 = c_5 s_{-4}$ $y_2 = c_0(s_2 + s_{-8}) + c_2(s_0 + s_{-6}) + c_4(s_{-2} + s_{-4})$ $y_3 = c_5 s_{-2}$ $y_4 = c_0(s_4 + s_{-6}) + c_2(s_2 + s_{-4}) + c_4(s_0 + s_{-2})$

DECIMATION $y_0 = c_0(s_0 + s_{-10}) + c_2(s_{-2} + s_{-8}) + c_4(s_{-4} + s_{-6}) + c_5 s_{-5}$ $y_1 = x$ $y_2 = c_0(s_2 + s_{-8}) + c_2(s_0 + s_{-6}) + c_4(s_{-2} + s_{-4}) + c_5 s_{-3}$ $y_3 = x$ $y_4 = c_0(s_4 + s_{-6}) + c_2(s_2 + s_{-4}) + c_4(s_0 + s_{-2}) + c_5 s_{-1}$

*FIG. 8*

COMBINED INTERPOLATION AND DECIMATION FILTER FOR PROGRAMMABLE LOGIC DEVICE

BACKGROUND OF THE INVENTION

This invention relates to programmable logic devices (PLDs), and, more particularly, to specialized processing blocks which may be included in such devices.

As applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, a PLD sold by Altera Corporation, of San Jose, Calif., under the name STRATIX® II includes DSP blocks, each of which includes four 18-by-18 multipliers. Each of those DSP blocks also includes adders and registers, as well as programmable connectors (e.g., multiplexers) that allow the various components to be configured in different ways. In each such block, the multipliers can be configured not only as four individual 18-by-18 multipliers, but also as four smaller multipliers, or as one larger (36-by-36) multiplier. In addition, one 18-by-18 complex multiplication (which decomposes into two 18-by-18 multiplication operations for each of the real and imaginary parts) can be performed.

Such a DSP block may be configured as a finite impulse response (FIR) filter, with 18-bit data and coefficients. Each block may be used to perform the summation of four 18-by-18 multiplications to form a 4-tap sub-block of a longer FIR filter.

Many types of FIR filters may be encountered. Two of those types are an interpolation FIR filter—in which the number of samples is increased by a factor of n by inserting ("interpolating") n−1 samples between adjacent samples—and a decimation FIR filter—in which the number of samples is decreased by a factor of n by removing n−1 out of every n samples. A DSP block that may be configured as different types of filters, including an interpolation FIR filter and a decimation FIR filter, is shown in copending, commonly-assigned U.S. patent application Ser. No. 11/447,370, filed Jun. 5, 2006, which is hereby incorporated by reference herein in its entirety.

One application of interpolation and decimation filters is in wireless communication systems based on TDD (time division duplexing) mode, such as GSM, 3G LTE and TD-CDMA. In those systems, a filter may need to work some of the time in decimation mode, and some of the time in interpolation mode. For example, such systems include digital up-converters (DUCs), which include interpolation filters, and digital down-converters (DDCs), which include decimation filters. Separate filters can be included for the DUCs and the DDCs, but the DUCs and the DDCs never operate at the same time, meaning that at any one time, half of the filters would be idle. Therefore, there would be efficiencies, in terms of the number of multipliers used, if a single filter could operate in either interpolation mode or decimation mode on demand, changing modes in real time "on the fly." However, it has heretofore been difficult to create a filter which can be switched between the two modes during run time, and at the same time uses as few multipliers as possible.

It would be desirable to be able to provide, in a PLD, a specialized processing block, such as a DSP block, that can be configured as a FIR filter capable of performing both interpolation and decimation and of changing modes in real time.

SUMMARY OF THE INVENTION

The present invention relates to specialized processing blocks for PLDs wherein a specialized processing block can be configured as a FIR filter capable of performing both interpolation and decimation, and of changing modes in real time.

As discussed in more detail below, it is apparent from the mathematics of interpolation filters and decimation filters that various coefficients, samples and products thereof are reused at least once. Therefore, by introducing appropriate delays and buffers, and selecting them when appropriate, a filter that can operate on demand as either an interpolation filter or a decimation filter can be provided. Because coefficients, samples and products may be reused, the filter can use as few as two multipliers.

Therefore, in accordance with the present invention, there is provided a FIR filter structure for selectively operating in one of an interpolation filter mode and decimation filter mode. The FIR filter structure includes a number of multipliers N, where N can be expressed as follows:

$N = INT[CT/(snSH)] + 1$ when MOD $[CT/(snSH)] \neq 0$, and $N = CT/(snSH)$ when MOD $[CT/(snSH)] = 0$ where:
C = the number of channels,
T = the number of taps,
s = 1 for an asymmetric filter,
s = 2 for a symmetric filter,
n = the interpolation/decimation factor,
S = timesharing factor (i.e., the number of clock cycles available to the system to process one input or output sample,
H = is factor that represents whether the case is a fullband case (H=1) or a halfband case (H=2) in which all odd coefficients with the exception of the middle coefficient are zero,
MOD $[x] = x - INT[x]$, and
INT[x] is the largest integer in x.

This can be as few as one multiplier. Each of the N multipliers has a sample input and a coefficient input, and the coefficient input cycles through a plurality of coefficients. At least one circuit adds outputs of the multipliers to each other, with a respective selectable delay located at least one of (a) before, and (b) after, each of the adding circuits. The FIR filter structure to allow selection between an interpolation filter mode and a decimation filter mode during operation of said FIR filter structure, with the selection including selection of at least one of the respective selectable delays.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 8 is a representation of calculations needed to perform interpolation and decimation in an 11-tap FIR filter;

DETAILED DESCRIPTION OF THE INVENTION

A FIR filter calculates a weighted sum of a finite number of inputs, summing a number of multiplication results, where each multiplication is between a sample and a coefficient. Each such multiplication may be referred to as a "tap." Mathematically, a FIR filter may be described as:

$$Y_k = \sum_{i=0}^{Taps-1} ci \cdot Sk - i$$

where $Y_k$ is the kth output term, $c_i$ is the ith coefficient, $s_{k-i}$ is the (k-i)th sample, and Taps is the number of taps in the filter.

In the case of interpolation, one inserts zeroes between the input samples before filtering. In the case, for example, of interpolation by two, one can fill all odd-numbered samples with zeroes, which introduces a regular pattern of zeroes into the equations. The same circuitry that is used as an ordinary FIR filter could be used to perform the interpolation filtering, but it would be idle half the time as the inputs would be zero, which would be wasteful. For interpolation by a higher factor n, the circuitry would be idle for (n−1)/n cycles.

Similarly in the case of decimation, no calculation is necessary on n−1 of every n cycles. Again, ordinary FIR filter circuitry could be used, computing each cycle and discarding the unneeded results, but that also would be wasteful.

The invention will now be described with reference to FIGS. 1-9.

Figure 1:
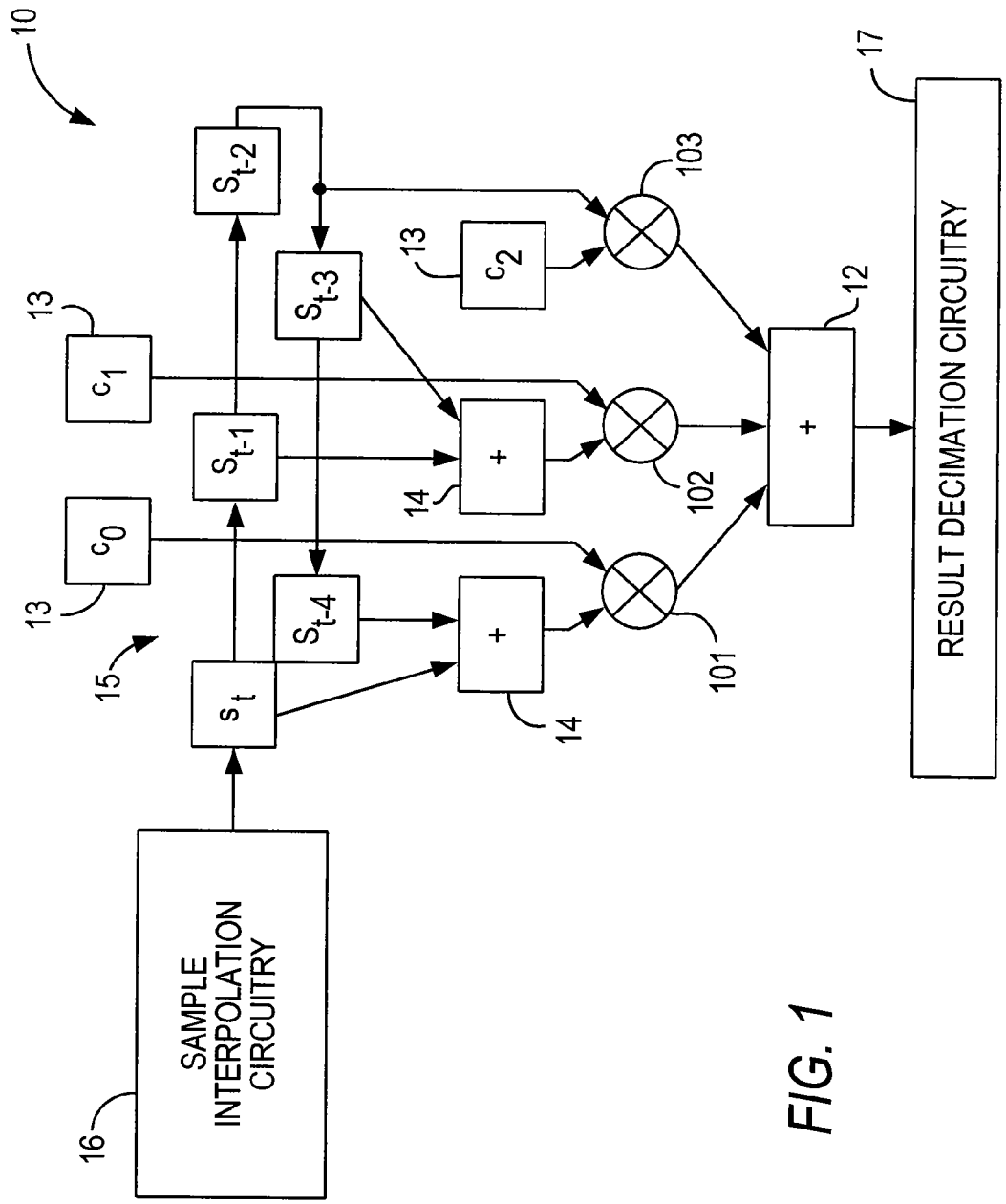
FIG. 1 is a schematic representation of a 5-tap FIR filter adapted to perform interpolation or decimation.

Known 5-tap filter circuitry 10 of FIG. 1 can be used for either interpolation or decimation. Circuitry 10 includes three multipliers 101, 102, 103 preferably followed by adder 12. On the input side preferably are three coefficient memories or registers 13, one preferably feeding a first input of each multiplier 101-103. An adder 14 preferably is provided at the second input of each multiplier 101 and 102 and input sample chain 15 preferably loops around so that sample $s_{t-2}$ is fed to the second input of multiplier 103, while the sum of samples $s_t$ and $s_{t-4}$ is fed to the second input of multiplier 101 and the sum of samples $s_{t-1}$ and $s_{t-3}$ is fed to the second input of multiplier 102.

At the beginning of sample chain 15, sample interpolation circuitry 16 preferably is provided to insert n−1 zeroes between each sample for an interpolation factor of n. Thus, in a common case of n=2, one zero is inserted between each sample.

Similarly, at the output of adder 14, result decimation circuitry 17 preferably is provided to delete n−1 out of every n results for an interpolation factor of n. Thus, in a common case of n=2, every other result is deleted.

While circuitry 10 can perform both interpolation and decimation on demand at run time, it does not take advantage of the zero-sample (in the case of interpolation) or zero-result (in the case of decimation) instances to reduce the number of multipliers needed. Thus, 5-tap interpolation/decimation filter 10 requires three multipliers.

Figure 2:
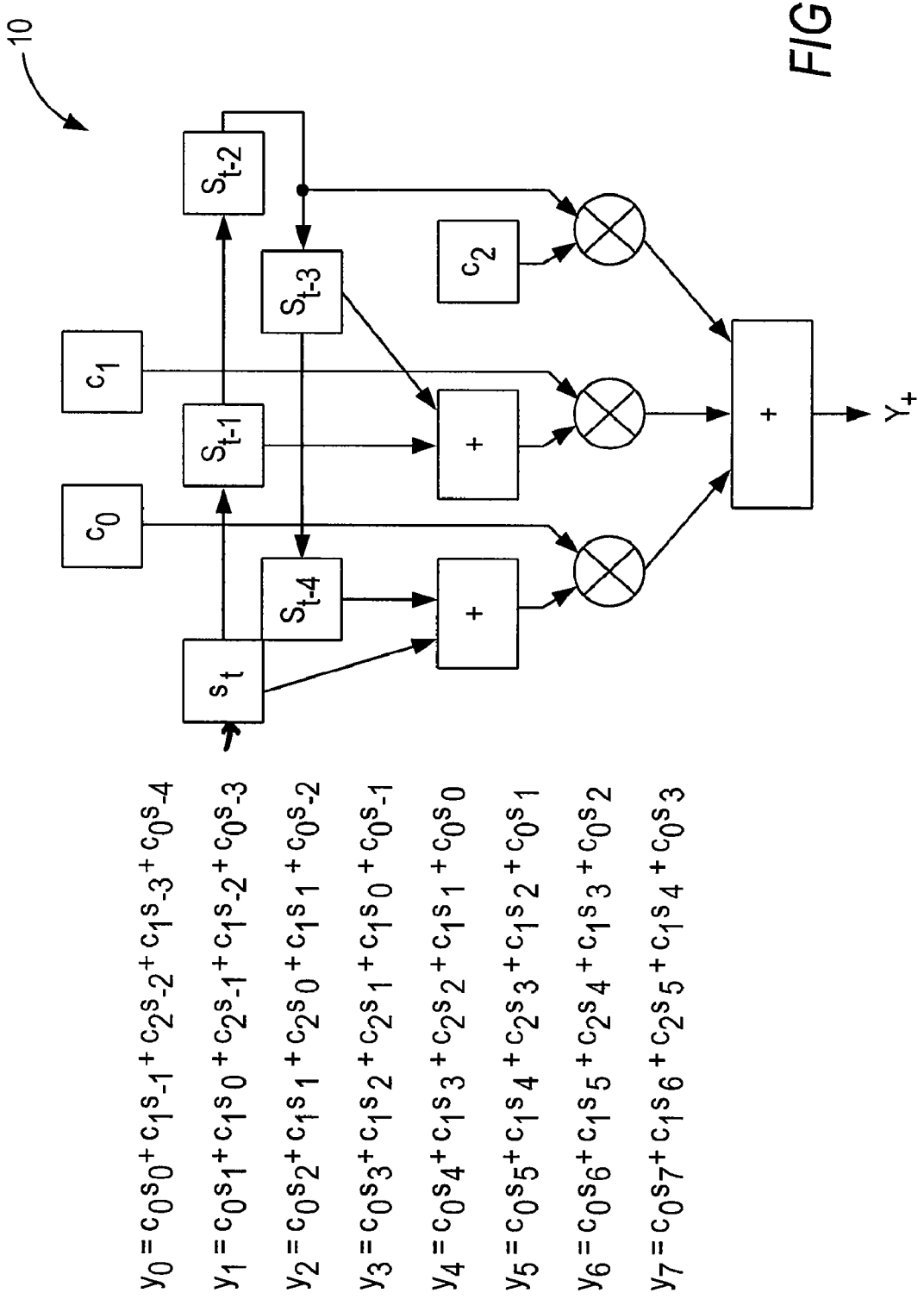
FIGS. 2 and 3 are representations of calculations needed to perform interpolation, and of intermediate values to be stored.
Figure 3:
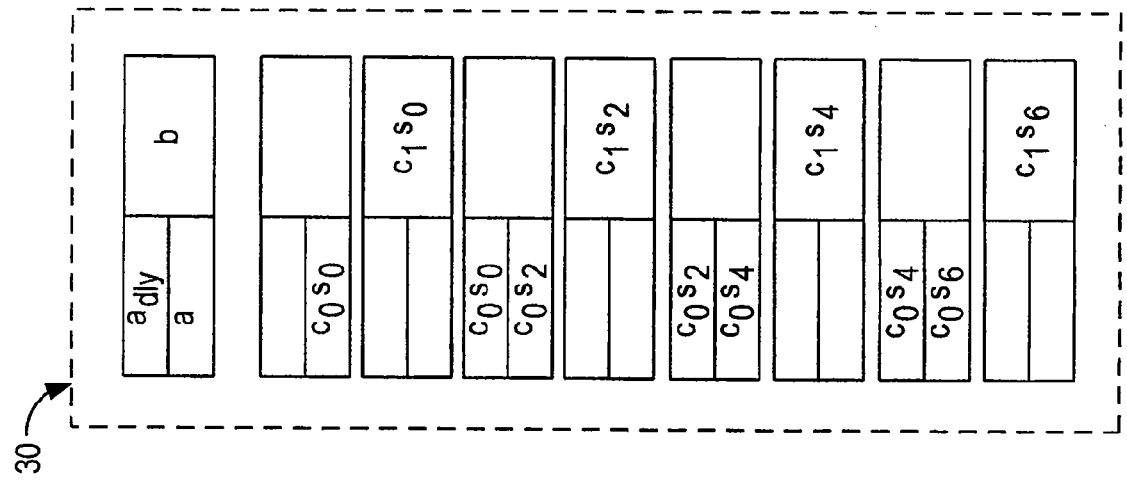
Figure 4:
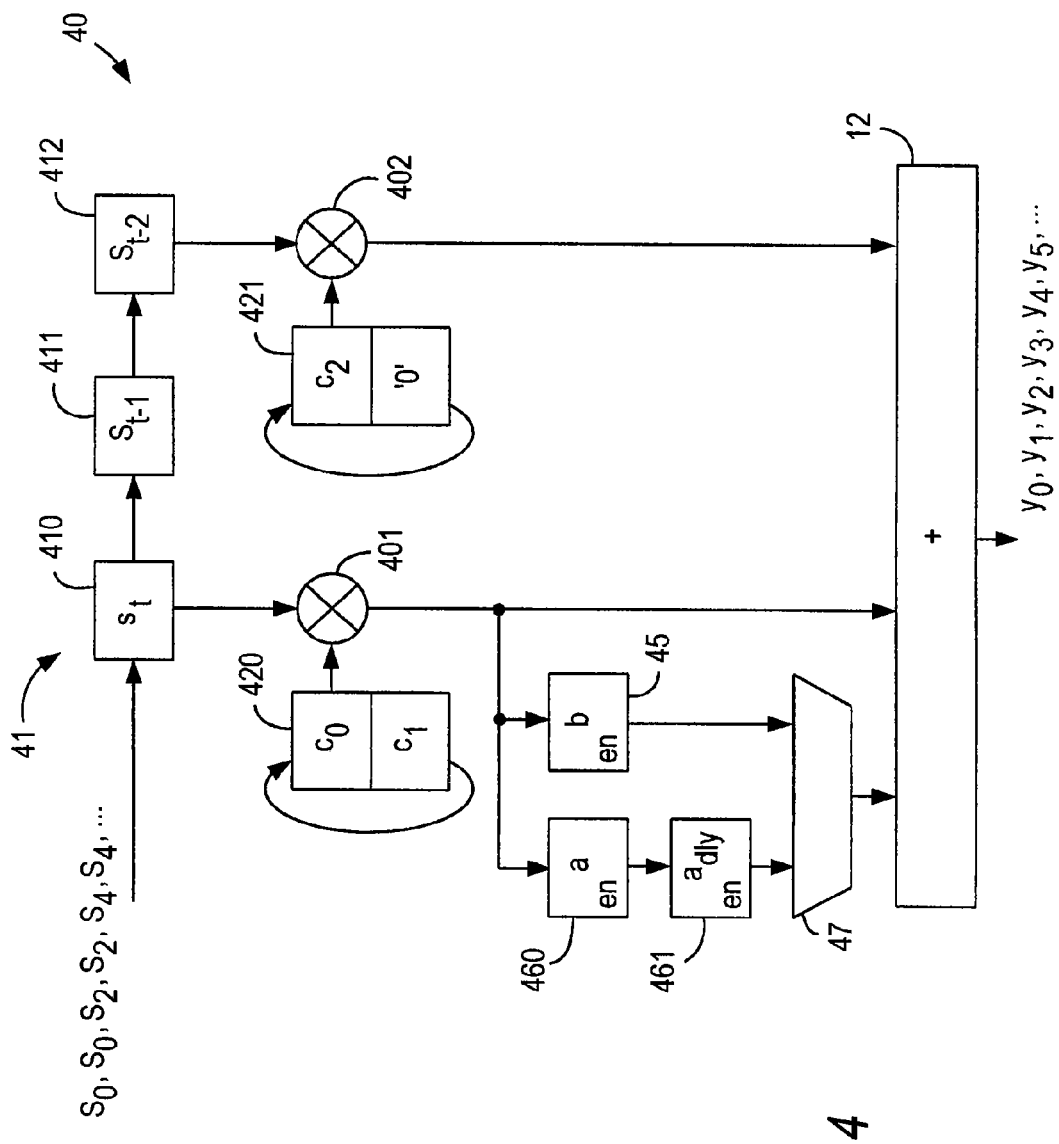
FIG. 4 is a block diagram of a FIR filter adapted to perform interpolation in accordance with FIGS. 2 and 3.

However, review of the mathematics shown in FIGS. 2 and 3 reveals that the interpolation circuit 40 of FIG. 4 can be constructed. FIG. 2 shows the eight results of the operation of circuitry 10 starting with an arbitrary sample $s_0$ (this actually includes references to samples as early as $s_{-4}$). As can be seen, a number of terms are reused. Specifically, $c_0 s_n$ is used in $y_n$ and reused four cycles later in $y_{n+4}$. For example, $c_0 s_0$ is used in $y_0$ and $y_4$. Similarly, $c_1 s_n$ is used in $y_{n+1}$ and reused two cycles later in $y_{n+3}$. In the case of interpolation by a factor of 2, every other input is going to be zero. This means that instead of using three multipliers for a 5-tap interpolation filter, one can use two multipliers and spread the computation of each term over two cycles (because the circuit will otherwise be computing a zero result at that time, based on the zero input).

This is illustrated in FIG. 3, where on the left, every other sample in the equations of FIG. 2 has been set to zero. The boxes 30 of FIG. 3 represent storage of the intermediate results computed as shown on the right side of FIG. 3. The values a and b are computed in alternate cycles, while the value $a_{dly}$ represents the value a delayed by two cycles (i.e., the value a as computed during the previous cycle in which a was computed).

This is implemented in the circuitry 40 of FIG. 4. Circuitry 40 preferably includes two multipliers 401, 402, preferably followed by adder 12. In addition to feeding adder 12, the output of multiplier 401 preferably also feeds a register 45 which preferably stores the value b of FIG. 3, and preferably also feeds a register 460 which preferably stores the value a of FIG. 3 and in turn feeds a register 461 which preferably stores the value $a_{dly}$ of FIG. 3. Registers 45, 461 preferably feed a multiplexer 47 which preferably can controllably select either register 45, 461 as appropriate.

On the input side, sample chain 41 preferably includes, in this 5-tap case, three registers 410, 411, 412 connected to feed respective first inputs of multipliers 401, 402 as shown. Because in interpolation every other sample $s_1$, $s_3$, $s_5$, etc., is zeroed out, in accordance with the invention two steps are used to compute the results for the remaining samples, and therefore sample chain 41 preferably is supplied with each remaining sample $s_0$, $s_2$, $s_4$, etc. twice as indicated. The respective second inputs of multipliers 401, 402 are fed by respective coefficient registers 420, 421. In this 5-tap case, the value in register 420 alternates between coefficients $c_0$, $c_1$, while the value in register 421 alternates between coefficient $c_2$ and zero. The cycling of the coefficients occurs at a clock speed that is faster than the input sample rate by the interpolation factor—i.e., in this example the clock speed is twice the input sample rate. When the coefficients are set to $c_0$ and $c_2$, multiplexer 47 selects register 461 containing the value $a_{dly}$. When the coefficients are set to $c_1$ and zero, multiplexer 47 selects register 45 containing the value b. Adder 12 adds the output of multiplexer 47 to the products generated by multipliers 401, 402 to generate the filter output.

Figure 5:
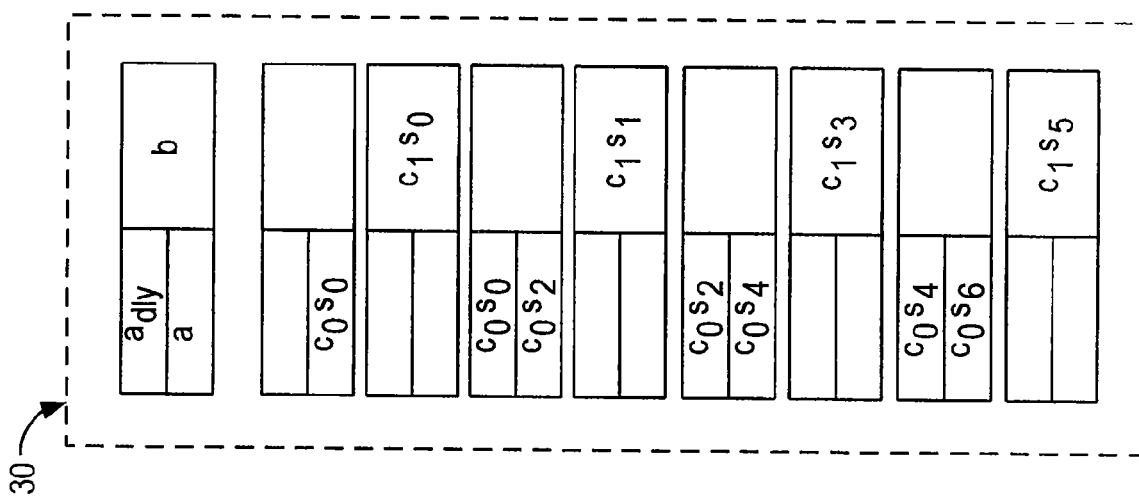
FIG. 5 is a representation of calculations needed to perform decimation, and of intermediate values to be stored.

The decimation case is similar. Review of the mathematics shown in FIG. 5 reveals that the decimation circuitry 60 of FIG. 6 can be constructed. FIG. 5 is similar to FIG. 3, except that different values are stored in b. One can see that in the case of decimation by a factor of 2, where every other computation is going to be deleted, the remaining computations can be broken in two and accumulated over two cycles, while the previous value is output for two cycles. This means that instead of using three multipliers for a 5-tap interpolation filter, one can use two multipliers.

Figure 6:
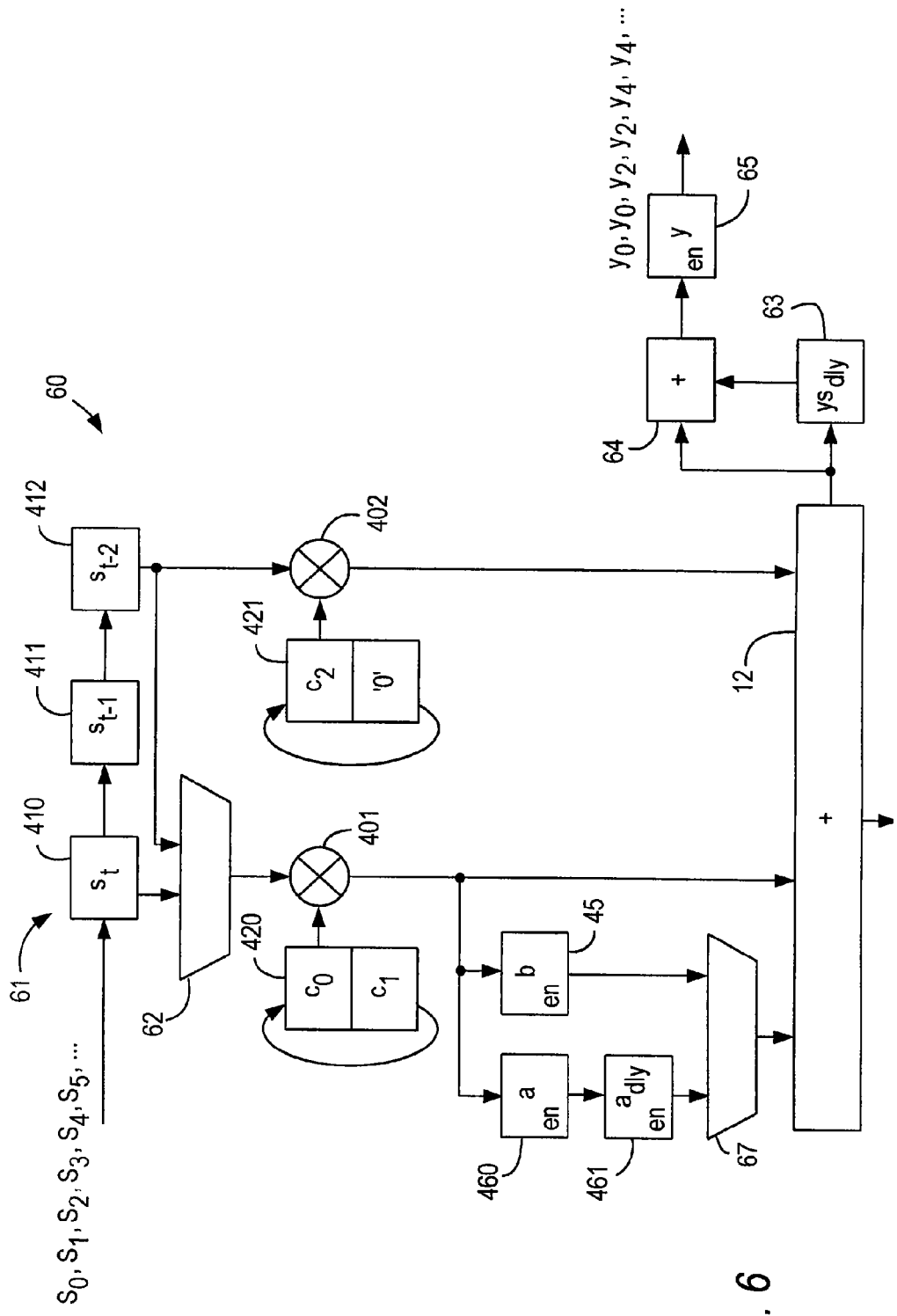
FIG. 6 is a block diagram of a FIR filter adapted to perform decimation in accordance with FIG. 5.
Figure 7:
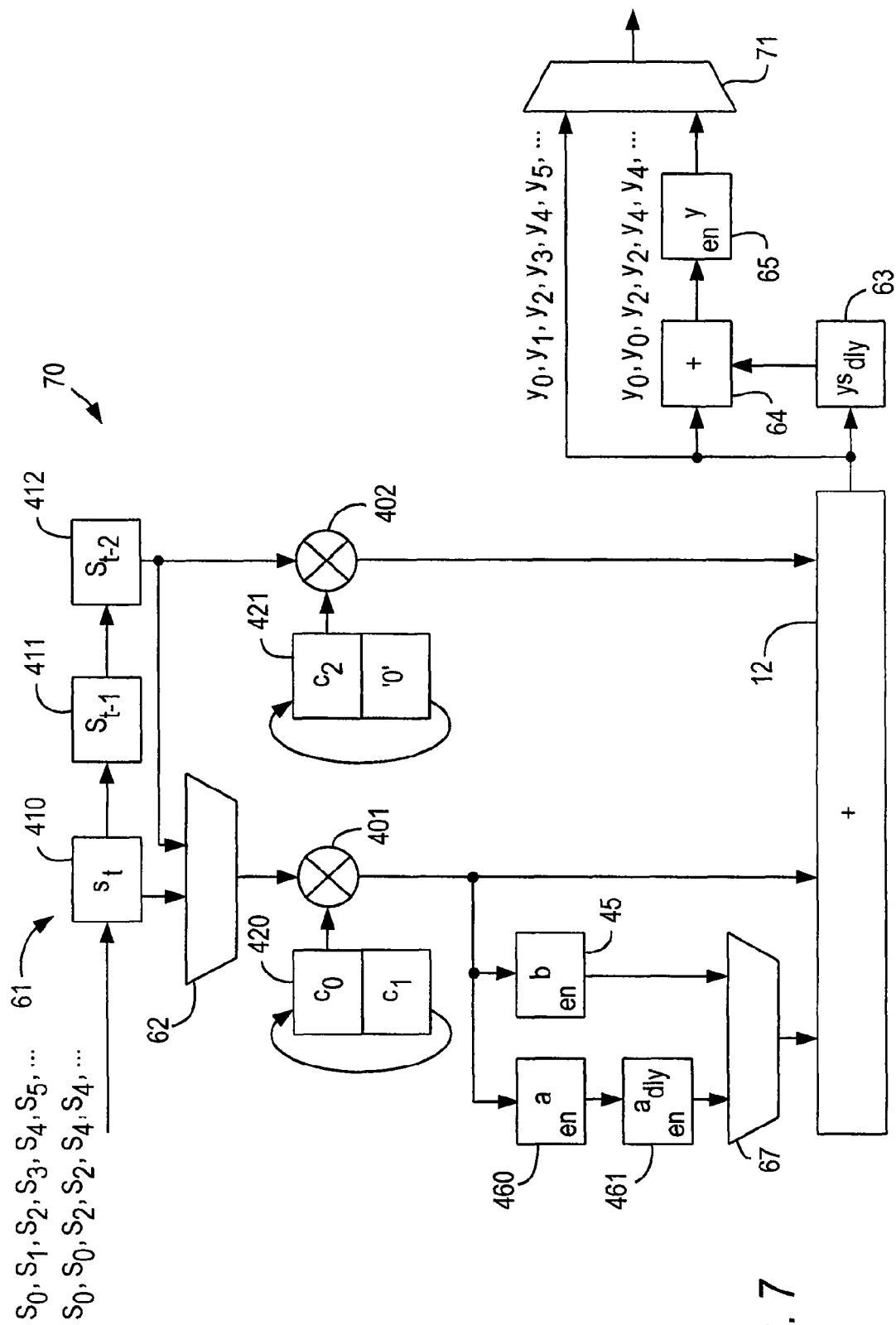
FIG. 7 is a block diagram of a first preferred embodiment of a FIR filter in accordance with the present invention adapted to perform both interpolation and decimation.

This is implemented in the circuitry 60 of FIG. 6. Circuitry 60 preferably includes two multipliers 401, 402, preferably followed by adder 12. In addition to feeding adder 12, the output of multiplier 401 preferably also feeds a register 45 which preferably stores the value b of FIG. 5, and preferably also feeds a register 460 which preferably stores the value a of FIG. 5 and in turn feeds a register 461 which preferably stores the value $a_{dly}$ of FIG. 5. Registers 45, 461 preferably feed a multiplexer 67 which preferably can controllably select either register 45, 461 as appropriate.

On the input side, sample chain 61 preferably includes, in this 5-tap case, three registers 410, 411, 412 in series. Register 410 preferably is connected to feed the first input of multiplier 401 through multiplexer 62, as shown. Multiplexer 62 also can select the output of register 412 to feed the first input of multiplier 401. Register 412 preferably also feeds the first input of multiplier 402. The respective second inputs of multipliers 401, 402 are fed by respective coefficient registers 420, 421. In this 5-tap case, the value in register 420 alternates between coefficients $c_0$, $c_1$, while the value in register 421 alternates between coefficient $c_2$ and zero. The cycling of the coefficients occurs at a clock speed that is the same as the input sample rate. In clock cycles in which the coefficients are set to $c_0$ and $c_2$ (these may be referred to as "odd" cycles), samples $s_t$ and $s_{t-2}$ are needed, and multiplexer 62 selects the output or register 410. At the same time, multiplexer 67 selects register 461 containing the value $a_{dly}$. In "even" cycles, in which the coefficients are set to $c_1$ and zero, sample $s_{t-1}$ is needed and multiplexer 62 selects the output of register 412 (it will be appreciated from FIG. 6, which shows an odd cycle, the by the next even cycle, $s_{t-1}$ will have moved into register 412). At the same time, multiplexer 67 selects register 45 containing the value b.

Adder 12 adds the output of multiplexer 67 to the products generated by multipliers 401, 402. That sum is accumulated over two cycles using register 63 and adder 64. The accumulated output is registered at 65 and output on two successive clock cycles as the filter output.

As can be seen, circuitry 60 is identical to circuitry 40 except for the addition, in circuitry 60, of multiplexer 62 between registers 410, 412 and multiplier 402, and the addition of output adder 64 and registers 63, 65 to accumulate the output. Thus, in accordance with the present invention, circuitry on a PLD, preferably including DSP blocks as discussed above, can be configured as circuitry 70 (FIG. 7), which can function in either interpolation or decimation mode on demand. Circuitry 70 is substantially identical to circuitry 60, with the addition only of output multiplexer 71 to select either the direct output of adder 12 or the accumulated, registered output of register 65. In interpolation mode, multiplexer 62 always selects register 410, and output multiplexer 71 selects adder 12. In decimation mode, multiplexer 62 selects either register 410 or register 412 as in circuitry 60, and multiplexer 71 selects register 65. The switch between interpolation mode and decimation mode thus requires only changing the control signals for multiplexers 62, 71, which is easily done at run time, as well as adjustments to the timing which also is easily done at run time.

Circuitry 70 can be implemented in a PLD by using the multipliers of a DSP block such as that described in above-incorporated application Ser. No. 11/447,370. If the DSP block has an input register stage and an input multiplexer stage as described in application Ser. No. 11/447,370, then registers 411, 411, 412 and multiplexer 62 can be implemented inside the DSP block. But if the DSP block does not have an input multiplexer stage, then registers 411, 411, 412 and multiplexer 62 would have to be implemented outside the DSP block, in the programmable logic of the PLD. Multiplexer 47 cannot be implemented in the DSP block of application Ser. No. 11/447,370. Therefore, multiplexer 67 and everything that follows it would have to be implemented outside the DSP block, in the programmable logic of the PLD, although there may be a PLD having a DSP block in which multiplexer 67 and at least some of the subsequent circuitry can be implemented within the DSP block.

The number N of multipliers can be expressed as follows:

$N=INT[CT/(snSH)]+1$ when MOD $[CT/(snSH)]\neq 0$, and $N=CT/(snSH)$ when MOD $[CT/(snSH)]=0$ where:
C=the number of channels,
T=the number of taps,
s=1 for an asymmetric filter,
s=2 for a symmetric filter,
n=the interpolation/decimation factor,
S=timesharing factor (i.e., the number of clock cycles available to the system to process one input or output sample,
H is factor that represents whether the case is a fullband case (H=1) or a halfband case (H=2) in which all odd coefficients with the exception of the middle coefficient are zero, MOD $[x]=x-INT[x]$, and INT[x] is the largest integer in x.

For a one-channel, fullband, symmetric case without time-sharing, this reduces to:

$N=INT[T/(2n)]+1$ when MOD $[T/(2n)]\neq 0$, and $T/(2n)$ when MOD $[T/(2n)]=0$

Thus, for a 5-tap symmetric filter with an interpolation/decimation factor of 2, N=INT[5/4]+1=INT[1.25]+1=2.

As the number of taps increases, the number of storage elements increases as well, as does the depth of the storage elements (i.e., the number of cycles of delay required for each storage element). Thus, for a one-channel, fullband, symmetric 9-tap FIR filter with an interpolation/decimation factor of 2, N=INT[9/4]+1=INT[2.25]+1=3. In addition to storage elements a and b, two additional storage elements aa and bb would be needed, one of which would have a depth of 3 and the other of which would have a depth of 4. In general, the depth is equal to the distance from the tap in question to the center tap, meaning, for N taps where N is odd, that the maximum depth of any storage element in the filter would be $((N+1)/2)-1$. This agrees with the example just given, where $((9+1)/2)-1=4$.

Figure 9:
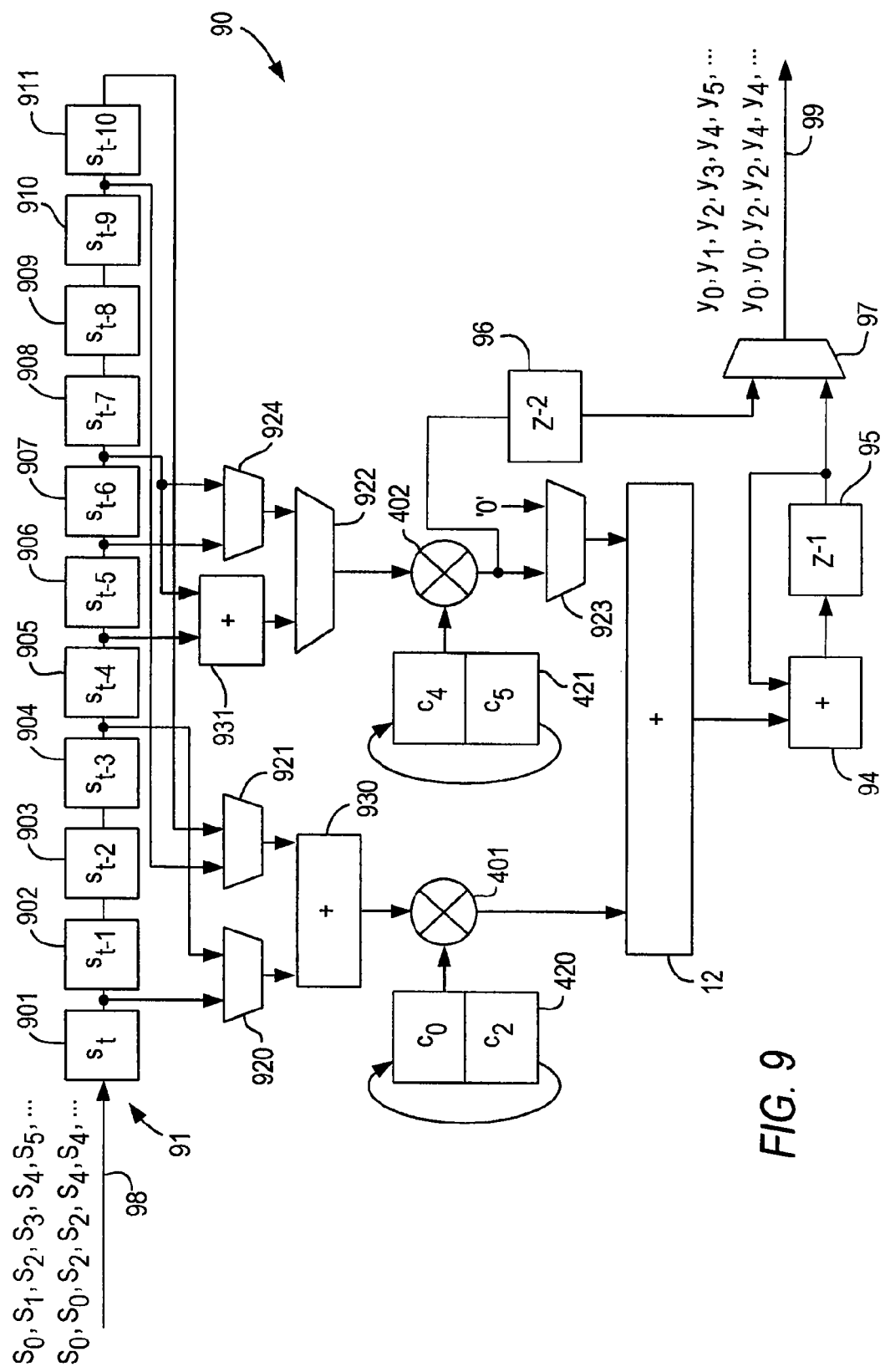
FIG. 9 is a block diagram of a second preferred embodiment of a FIR filter in accordance with the present invention adapted to perform both interpolation and decimation.

In an alternative case of a halfband 11-tap FIR filter, the mathematics of interpolation and decimation by a factor of 2 can be reduced to that shown in FIG. 8. As can be seen, there is significant overlap between the interpolation case and the decimation case, with the only difference being the terms involving coefficient $c_5$. Although this overlap only arises in the case of interpolation or decimation by 2, that is a commonly-used case. Thus, in accordance with the present invention, circuitry on a PLD, preferably including DSP blocks as discussed above, can be configured as circuitry 90 for performing interpolation or decimation in accordance with FIG. 8 (i.e., only in cases where the interpolation or decimation factor is 2), as shown in FIG. 9.

Circuitry 90 preferably includes two multipliers 401, 402, preferably followed by adder 12. A multiplexer 92 can select either the output of multiplier 402 or the value 0 to input to adder 12, while multiplier 401 preferably feeds adder 12 directly.

On the input side, sample chain 91 preferably includes, in this 11-tap case, eleven registers 901-911 in series. Registers 901 and 904 preferably are connected to feed a multiplexer 920 which selects the first input of an adder 930 which feeds a first input of multiplier 401. Registers 910 and 911 preferably are connected to feed a multiplexer 921 which selects the second input of adder 930. Registers 905 and 907 preferably are connected to feed an adder 931 which provides the first input of a multiplexer 922 which feeds a first input of multiplier 402. The second input of multiplexer 922 is the output of register 907 in the decimation case, or the output of register 906 in the interpolation case, as selected by multiplexer 923. The respective second inputs of multipliers 401, 402 are fed by respective coefficient registers 420, 421. In this special 11-tap case with an interpolation/decimation factor of 2, the value in register 420 alternates between coefficients $c_0$, $c_2$, while the value in register 421 alternates between coefficients $c_4$, $c_5$.

On the output side, following adder 12, adder 94 and one-cycle delay 95 allow accumulation of the output of adder 12. A two-cycle delay 96 is provided on the output of multiplier 402. Output multiplexer 97 selects between accumulator 94/95 and delay 96.

For interpolation, the lower sequence of input samples is provided at 98, and the upper sequence of outputs is generated at 99, while for decimation, the upper sequence of input samples is provided at 98, and the lower sequence of outputs is generated at 99.

For decimation, in the first clock cycle, $c_0 \times (s_t + s_{t-10}) + c_4 \times (s_{t-4} + s_{t-6})$ is calculated, and stored in the accumulator. In the second clock cycle, $c_2 \times (s_{t-2} + s_{t-8}) + c_5 \times s_{t-5}$ are calculated. By the second cycle, the samples have moved one step to the left in the pipeline of registers 901-911, which is why FIG. 9 shows the use of $s_{t-3}$, $s_{t-6}$ and $s_{t-9}$ in the latter calculation instead of $s_{t-2}$, $s_{t-5}$ and $s_{t-8}$. The results are fed into the accumulator 94/95, where they get added to the result of $c_0 \times (s_t + s_{t-10}) + c_4 \times (s_{t-4} + s_{t-6})$ from the previous clock cycle.

For interpolation, n the first clock cycle, $c_0 \times (s_t + s_{t-10}) + c_4 \times (s_{t-4} + s_{t-6})$ is calculated, and stored in the accumulator, as before. In the second clock cycle, $c_2 \times (s_{t-2} + s_{t-8})$ and $c_5 \times s_{t-4}$ are calculated. The result of $c_2 \times (s_{t-2} + s_{t-8})$ is added into accumulator 94/95. $c_5 \times s_{t-4}$ is stored separately in delay 96, and multiplexer 97 then switches the accumulator 94/95 or delay 96 to the output in alternative clock cycles. When delay 96 is selected by multiplexer 97, multiplexer 923 selects its 0 input.

As in the case of circuitry 70, the selections needed to switch between interpolation and decimation in circuitry 90 are easily performed at run time.

Circuitry 90 maps better onto a DSP block such as that of application Ser. No. 11/447,370 because there is nothing between multipliers 401, 402 and adder 12 except multiplexer 923, which can be provided in that DSP block. Moreover, this circuitry follows the expression above for the number of multipliers. Thus, in this symmetric halfband case with n=2, N=INT[11/(2×2×2)]+1=INT[11/8]+1=INT[1.375]+1=2, meaning there should be two multipliers as shown. Note that in the fullband symmetric 11-tap case, N=INT[11/4]+1=INT[2.75]+1=3, meaning there would be a third multiplier, as well as a third register with cycling coefficients, but two-cycle delay 96 would not be needed.

Thus it is seen that a FIR filter structure that can be implemented in a specialized processing block of a programmable logic device, and switched in real time between interpolation and decimation modes, has been provided.

Figure 10:
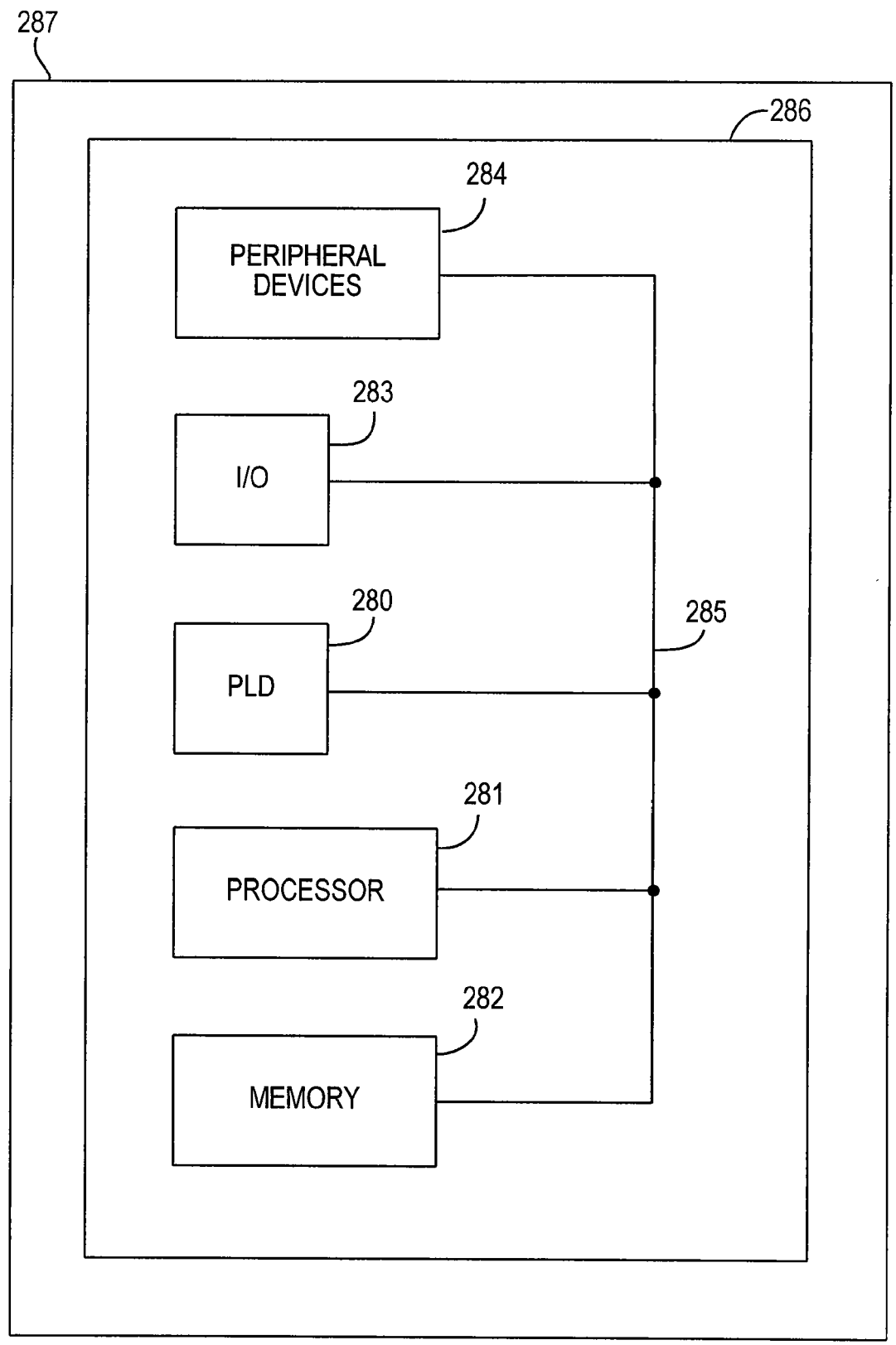
FIG. 10 is a simplified block diagram of an illustrative system employing a programmable logic device incorporating the present invention.

A PLD 280 incorporating such circuitry according to the present invention may be used in many kinds of electronic devices. One possible use is in a data processing system 900 shown in FIG. 10. Data processing system 900 may include one or more of the following components: a processor 281; memory 282; I/O circuitry 283; and peripheral devices 284. These components are coupled together by a system bus 285 and are populated on a circuit board 286 which is contained in an end-user system 287.

System 900 can be used in a wide variety of applications, such as computer networking, data networking, instrumentation, video processing, digital signal processing, or any other application where the advantage of using programmable or reprogrammable logic is desirable. PLD 280 can be used to perform a variety of different logic functions. For example, PLD 280 can be configured as a processor or controller that works in cooperation with processor 281. PLD 280 may also be used as an arbiter for arbitrating access to a shared resources in system 900. In yet another example, PLD 280 can be configured as an interface between processor 281 and one of the other components in system 900. It should be noted that system 900 is only exemplary, and that the true scope and spirit of the invention should be indicated by the following claims.

Various technologies can be used to implement PLDs 280 as described above and incorporating this invention.

Instructions for carrying out the method according to this invention may be encoded on a machine-readable medium, to be executed by a suitable computer or similar device to implement the method of the invention for programming PLDs. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 11:
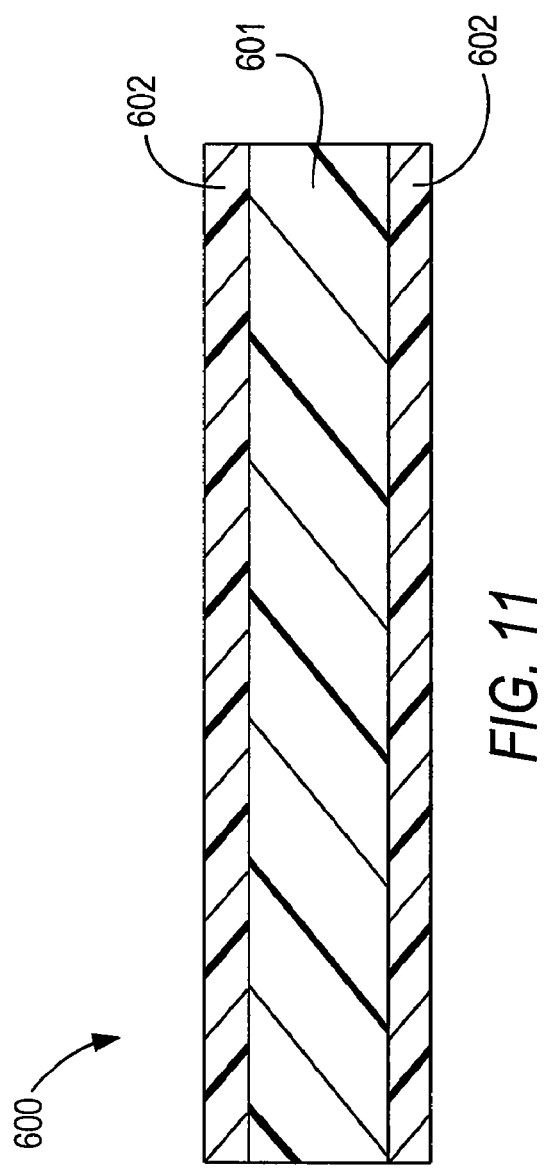
FIG. 11 is a cross-sectional view of a magnetic data storage medium encoded with a set of machine-executable instructions for performing the method according to the present invention.

FIG. 11 presents a cross section of a magnetic data storage medium 600 which can be encoded with a machine executable program that can be carried out by systems such as the aforementioned personal computer, or other computer or similar device. Medium 600 can be a floppy diskette or hard disk, or magnetic tape, having a suitable substrate 601, which may be conventional, and a suitable coating 602, which may be conventional, on one or both sides, containing magnetic domains (not visible) whose polarity or orientation can be altered magnetically. Except in the case where it is magnetic tape, medium 600 may also have an opening (not shown) for receiving the spindle of a disk drive or other data storage device.

The magnetic domains of coating 602 of medium 600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, as a filter in accordance with the invention.

Figure 12:
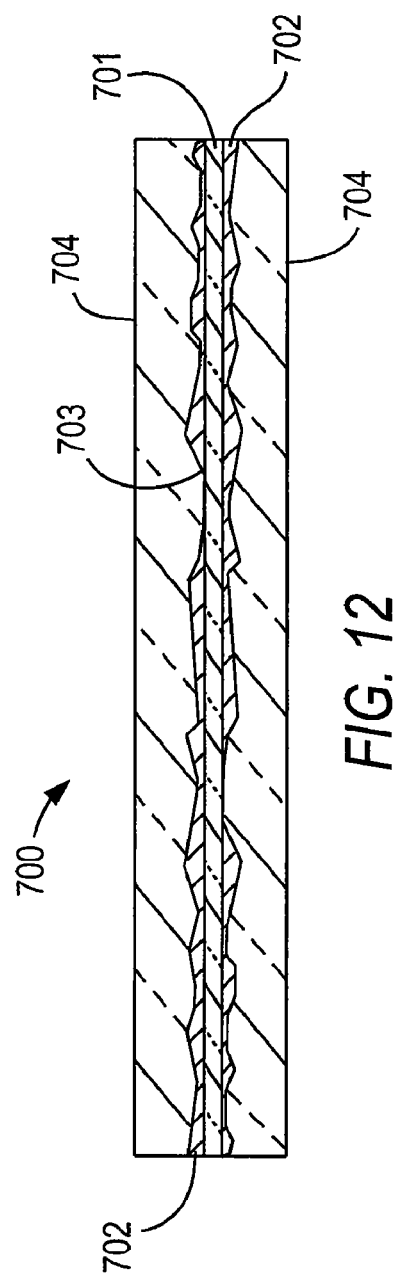
FIG. 12 is a cross-sectional view of an optically readable data storage medium encoded with a set of machine executable instructions for performing the method according to the present invention.

FIG. 12 shows a cross section of an optically-readable data storage medium 700 which also can be encoded with such a machine-executable program, which can be carried out by systems such as the aforementioned personal computer, or other computer or similar device. Medium 700 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 700 preferably has a suitable substrate 701, which may be conventional, and a suitable coating 702, which may be conventional, usually on one or both sides of substrate 701.

In the case of a CD-based or DVD-based medium, as is well known, coating 702 is reflective and is impressed with a plurality of pits 703, arranged on one or more layers, to encode the machine-executable program. The arrangement of pits is read by reflecting laser light off the surface of coating 702. A protective coating 704, which preferably is substantially transparent, is provided on top of coating 702.

In the case of magneto-optical disk, as is well known, coating 702 has no pits 703, but has a plurality of magnetic domains whose polarity or orientation can be changed magnetically when heated above a certain temperature, as by a laser (not shown). The orientation of the domains can be read by measuring the polarization of laser light reflected from coating 702. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A programmable logic device configured to include a Finite Impulse Response (FIR) filter structure for selectively operating in one of an interpolation filter mode and decimation filter mode; said programmable logic device having at least one specialized processing block each of which includes a plurality of multipliers and circuitry for adding outputs of said multipliers, at least one said specialized processing block being programmably configured as said FIR filter structure, said FIR filter structure comprising:

(1) a number N of multipliers, where:
N=INT [CT/(snSH)]+1 when MOD [CT/(snSH)]≠0,
N=CT/(snSH) when MOD [CT/(snSH)]=0,
C=the number of channels,
T=the number of taps,
s=1 for an asymmetric filter,
s=2 for a symmetric filter,
n=the interpolation/decimation factor,
S=a timesharing factor representing the number of clock cycles available to the system to process one input or output sample,
H is a factor that represents whether the case is a fullband case (H=1) or a halfband case (H=2) in which all odd coefficients with the exception of the middle coefficient are zero,
MOD [x]=x−INT[x], and
INT[x] is the largest integer in x;

(2) a sample input and a coefficient input for each of said N multipliers, said coefficient input cycling, during operation of said FIR filter structure, through a plurality of coefficients;

(3) at least one circuit for adding outputs of said multipliers to each other; and (4) a respective selectable delay located at least one of (a) before, and (b) after, each said circuit for adding; wherein:

selection between said interpolation filter mode and said decimation filter mode occurs during operation of said FIR filter structure; and said selection comprises selection of at least one said respective selectable delay.

2. The configured programmable logic device of claim 1 wherein said FIR filter structure comprises:

a first multiplier;

a first coefficient register providing one input to said first multiplier and cycling through a first plurality of coefficients;

a second multiplier;

a second coefficient register providing one input to said second multiplier and cycling through a second plurality of coefficients; and an input sample register chain comprising at least three registers starting at a first input sample register and ending at a last input sample register; wherein:

said last input sample register provides a second input to said second multiplier; said FIR filter structure further comprising:

a sample multiplexer that selects between said first sample register and said last sample register as a second input to said first multiplier;

an output adder having outputs of said first and second multipliers as first and second adder inputs;

a first intermediate register for storing a one-clock-cycle-delayed output of said first multiplier;

a second intermediate register for storing a two-clock-cycle-delayed output of said first multiplier;

an intermediate multiplexer for selecting between said first intermediate register and said second intermediate register as a third adder input of said output adder;

an accumulator that accumulates successive outputs of said output adder; and an output multiplexer that selects between said output adder and said accumulator to provide an output of said FIR filter structure.

3. The configured programmable logic device of claim 2 wherein said accumulator comprises a delay for outputting said accumulated adder outputs over more than one clock cycle.

4. The configured programmable logic device of claim 2 wherein:
said input sample register chain comprises three registers; and
said last input sample register is a third input sample register.

5. The configured programmable logic device of claim 2 wherein each respective one of said first and second coefficient registers cycles through a respective set of two coefficients.

6. The configured programmable logic device of claim 1 wherein said FIR filter structure comprises:
a first multiplier;
a first coefficient register providing one input to said first multiplier and cycling through a first plurality of coefficients;
a second multiplier;
a second coefficient register providing one input to said second multiplier and cycling through a second plurality of coefficients;
an input sample register chain comprising at least seven registers starting at a first input sample register and ending at a last input sample register;
a first input adder providing a second input to said first multiplier;
a second input adder providing a second input to said second multiplier;
a first input multiplexer selecting a first input to said first input adder and having as inputs said first sample register and said last sample register;
a second input multiplexer selecting a second input to said first input adder and having as inputs first and second intermediate sample registers;
a third input multiplexer selecting a first input to said second input adder and having as inputs third and fourth intermediate sample registers;
a fourth input multiplexer selecting a second input to said second input adder and having as inputs said fourth intermediate sample register and a fifth intermediate sample register;
an intermediate multiplexer selecting between output of said second multiplier and a zero input;
an output adder having as inputs output of said first multiplier and said intermediate multiplexer;
an accumulator that accumulates successive outputs of said output adder;
a two-clock-cycle delay having as an input output of said second input adder; and
an output multiplexer that selects between said accumulator and said two-clock-cycle delay to provide an output of said FIR filter structure.

7. The configured programmable logic device of claim 6 wherein:
said input sample register chain comprises eleven registers;
said first intermediate sample register comprises a fourth one of said sample registers;
said second intermediate sample register comprises a tenth one of said sample registers;
said third intermediate sample register comprises a fifth one of said sample registers;
said fourth intermediate sample register comprises a seventh one of said sample registers; and
said fifth intermediate sample register comprises a sixth one of said sample registers.

8. The configured programmable logic device of claim 6 wherein each respective one of said first and second coefficient registers cycles through a respective set of two coefficients.

9. A method of programmably configuring a Finite Impulse Response (FIR) filter structure in a programmable logic device, said programmable logic device having at least one specialized processing block each of which includes a plurality of multipliers and circuitry for adding outputs of said multipliers, said method comprising:
programmably configuring at least one said specialized processing block as a FIR filter structure; including:
(1) programmably configuring said FIR filter structure with a number N of multipliers, where:
$N = INT[CT/(snSH)] + 1$ when $MOD[CT/(snSH)] \neq 0$,
$N = CT/(snSH)$ when $MOD[CT/(snSH)] = 0$
C = the number of channels,
T = the number of taps,
s = 1 for an asymmetric filter,
s = 2 for a symmetric filter,
n = the interpolation/decimation factor,
S = a timesharing factor representing the number of clock cycles available to the system to process one input or output sample,
H is a factor that represents whether the case is a fullband case (H=1) or a halfband case (H=2) in which all odd coefficients with the exception of the middle coefficient are zero,
$MOD[x] = x - INT[x]$, and
$INT[x]$ is the largest integer in x;
(2) programmably configuring each of said N multipliers to have a sample input and a coefficient input, and programmably configuring said coefficient input to cycle through a plurality of coefficients;
(3) programmably configuring at least one circuit for adding outputs of said multipliers to each other;
(4) programmably configuring a respective selectable delay located at least one of (a) before, and (b) after, each said circuit for adding; and
(5) programmably configuring said FIR filter structure to allow selection between an interpolation filter mode and a decimation filter mode during operation of said FIR filter structure; wherein:
said selection comprises selection of at least one said respective selectable delay.

10. The method of claim 9 wherein said programmably configuring said FIR filter structure comprises programmably configuring said FIR filter structure to include:
a first multiplier;
a first coefficient register providing one input to said first multiplier and cycling through a first plurality of coefficients;
a second multiplier;
a second coefficient register providing one input to said second multiplier and cycling through a second plurality of coefficients; and
an input sample register chain comprising at least three registers starting at a first input sample register and ending at a last input sample register; wherein:
said last input sample register provides a second input to said second multiplier; said FIR filter structure further comprising:

a sample multiplexer that selects between said first sample register and said last sample register as a second input to said first multiplier;

an output adder having outputs of said first and second multipliers as first and second adder inputs;

a first intermediate register for storing a one-clock-cycle-delayed output of said first multiplier;

a second intermediate register for storing a two-clock-cycle-delayed output of said first multiplier;

an intermediate multiplexer for selecting between said first intermediate register and said second intermediate register as a third adder input of said output adder;

an accumulator that accumulates successive outputs of said output adder; and an output multiplexer that selects between said output adder and said accumulator to provide an output of said FIR filter structure.

11. The method of claim 10 comprising programmably configuring said accumulator to include a delay for outputting said accumulated adder outputs over more than one clock cycle.

12. The method of claim 10 comprising:
programmably configuring said input sample register chain to includes three registers; wherein:
said last input sample register is a third input sample register.

13. The method of claim 10 comprising programmably configuring each respective one of said first and second coefficient registers to cycle through a respective set of two coefficients.

14. The method of claim 9 wherein said programmably configuring said FIR filter structure comprises programmably configuring said FIR filter structure to include:
a first multiplier;
a first coefficient register providing one input to said first multiplier and cycling through a first plurality of coefficients;
a second multiplier;
a second coefficient register providing one input to said second multiplier and cycling through a second plurality of coefficients;
an input sample register chain comprising at least seven registers starting at a first input sample register and ending at a last input sample register;
a first input adder providing a second input to said first multiplier;
a second input adder providing a second input to said second multiplier;
a first input multiplexer selecting a first input to said first input adder and having as inputs said first sample register and said last sample register;
a second input multiplexer selecting a second input to said first input adder and having as inputs first and second intermediate sample registers;
a third input multiplexer selecting a first input to said second input adder and having as inputs third and fourth intermediate sample registers;
a fourth input multiplexer selecting a second input to said second input adder and having as inputs said fourth intermediate sample register and a fifth intermediate sample register;
an intermediate multiplexer selecting between output of said second multiplier and a zero input;
an output adder having as inputs output of said first multiplier and said intermediate multiplexer;
an accumulator that accumulates successive outputs of said output adder;

a two-clock-cycle delay having as an input output of said second input adder; and
an output multiplexer that selects between said accumulator and said two-clock-cycle delay to provide an output of said FIR filter structure.

15. The method of claim 14 comprising:
programmably configuring said input sample register chain to include eleven registers; wherein:
said first intermediate sample register comprises a fourth one of said sample registers;
said second intermediate sample register comprises a tenth one of said sample registers;
said third intermediate sample register comprises a fifth one of said sample registers;
said fourth intermediate sample register comprises a seventh one of said sample registers; and
said fifth intermediate sample register comprises a sixth one of said sample registers.

16. The method of claim 14 comprising programmably configuring each respective one of said first and second coefficient registers to cycle through a respective set of two coefficients.

17. A data storage medium encoded with machine-executable instructions for performing a method of programmably configuring as a Finite Impulse Response (FIR) filter structure in a programmable logic device, said programmable logic device having at least one specialized processing block each of which includes a plurality of multipliers and circuitry for adding outputs of said multipliers, said instructions comprising:
instructions for programmably configuring at least one said specialized processing block as a FIR filter structure; including:
(1) instructions for programmably configuring said FIR filter structure with a number N of multipliers, where:
N=INT [CT/(snSH)]+1 when MOD [CT/(snSH)]≠0, and
N=CT/(snSH) when MOD [CT/(snSH)]=0
C=the number of channels,
T=the number of taps,
s=1 for an asymmetric filter,
s=2 for a symmetric filter,
n=the interpolation/decimation factor,
S=a timesharing factor representing the number of clock cycles available to the system to process one input or output sample,
H is a factor that represents whether the case is a fullband case (H=1) or a halfband case (H=2) in which all odd coefficients with the exception of the middle coefficient are zero,
MOD [x]=x−INT[x], and
INT[x] is the largest integer in x;
(2) instructions for programmably configuring each of said N multipliers to have a sample input and a coefficient input, and programmably configuring said coefficient input to cycle through a plurality of coefficients;
(3) instructions for programmably configuring at least one circuit for adding outputs of said multipliers to each other;
(4) instructions for programmably configuring a respective selectable delay located at least one of (a) before, and (b) after, each said circuit for adding; and
(5) instructions for programmably configuring said FIR filter structure to allow selection between an interpolation filter mode and a decimation filter mode during operation of said FIR filter structure; wherein:
said selection comprises selection of at least one said respective selectable delay.

18. The data storage medium of claim 17 wherein said instructions for said programmably configuring said FIR filter structure comprise instructions for programmably configuring said FIR filter structure to include:
- a first multiplier;
- a first coefficient register providing one input to said first multiplier and cycling through a first plurality of coefficients;
- a second multiplier;
- a second coefficient register providing one input to said second multiplier and cycling through a second plurality of coefficients; and
- an input sample register chain comprising at least three registers starting at a first input sample register and ending at a last input sample register; wherein:
- said last input sample register provides a second input to said second multiplier; said FIR filter structure further comprising:
- a sample multiplexer that selects between said first sample register and said last sample register as a second input to said first multiplier;
- an output adder having outputs of said first and second multipliers as first and second adder inputs;
- a first intermediate register for storing a one-clock-cycle-delayed output of said first multiplier;
- a second intermediate register for storing a two-clock-cycle-delayed output of said first multiplier;
- an intermediate multiplexer for selecting between said first intermediate register and said second intermediate register as a third adder input of said output adder;
- an accumulator that accumulates successive outputs of said output adder; and
- an output multiplexer that selects between said output adder and said accumulator to provide an output of said FIR filter structure.

19. The data storage medium of claim 18 wherein said instructions comprise instructions for programmably configuring said accumulator to include a delay for outputting said accumulated adder outputs over more than one clock cycle.

20. The data storage medium of claim 18 wherein:
said instructions comprise instructions for programmably configuring said input sample register chain to includes three registers; including:
configuring a third input sample register as said last input sample register.

21. The data storage medium of claim 18 wherein said instructions comprise instructions for programmably configuring each respective one of said first and second coefficient registers to cycle through a respective set of two coefficients.

22. The data storage medium of claim 17 wherein said instructions for said programmably configuring said FIR filter structure comprise instructions for programmably configuring said FIR filter structure to include:
- a first multiplier;
- a first coefficient register providing one input to said first multiplier and cycling through a first plurality of coefficients;
- a second multiplier;
- a second coefficient register providing one input to said second multiplier and cycling through a second plurality of coefficients;
- an input sample register chain comprising at least seven registers starting at a first input sample register and ending at a last input sample register;
- a first input adder providing a second input to said first multiplier;
- a second input adder providing a second input to said second multiplier;
- a first input multiplexer selecting a first input to said first input adder and having as inputs said first sample register and said last sample register;
- a second input multiplexer selecting a second input to said first input adder and having as inputs first and second intermediate sample registers;
- a third input multiplexer selecting a first input to said second input adder and having as inputs third and fourth intermediate sample registers;
- a fourth input multiplexer selecting a second input to said second input adder and having as inputs said fourth intermediate sample register and a fifth intermediate sample register;
- an intermediate multiplexer selecting between output of said second multiplier and a zero input;
- an output adder having as inputs output of said first multiplier and said intermediate multiplexer;
- an accumulator that accumulates successive outputs of said output adder;
- a two-clock-cycle delay having as an input output of said second input adder; and
- an output multiplexer that selects between said accumulator and said two-clock-cycle delay to provide an output of said FIR filter structure.

23. The data storage medium of claim 22 wherein:
said instructions comprise instructions for programmably configuring said input sample register chain to include eleven registers; including:
configuring a fourth one of said sample registers as said first intermediate sample register;
configuring a tenth one of said sample registers as said second intermediate sample register;
configuring a fifth one of said sample registers as said third intermediate sample register;
configuring a seventh one of said sample registers as said fourth intermediate sample register; and
configuring a sixth one of said sample registers as said fifth intermediate sample register.

24. The data storage medium of claim 22 wherein said instructions comprise instructions for programmably configuring each respective one of said first and second coefficient registers to cycle through a respective set of two coefficients.

* * * * *